United States Patent [19] [11] Patent Number: 4,959,560
Ootani [45] Date of Patent: Sep. 25, 1990

[54] ERROR PREVENTING CIRCUIT
[75] Inventor: Takayuki Ootani, Tokyo, Japan
[73] Assignee: Kabushiki Kaisha Toshiba, Kawasaki, Japan
[21] Appl. No.: 320,741
[22] Filed: Mar. 8, 1989
[30] Foreign Application Priority Data
Mar. 8, 1988 [JP] Japan .................................. 63-52524
[51] Int. Cl.$^5$ ...................... H03K 17/16; H03K 3/01; H03K 19/094
[52] U.S. Cl. ................................... 307/443; 307/451; 307/491; 307/542; 307/546; 307/572; 307/262; 307/296.4; 307/296.5
[58] Field of Search .............. 307/443, 448, 451, 491, 307/510, 542, 546, 572, 296.4–296.6, 296.8, 262

[56] References Cited
U.S. PATENT DOCUMENTS
4,290,119 9/1981 Masudo et al. .................. 307/296.4
4,833,341 5/1989 Watanabe et al. .................. 307/491

OTHER PUBLICATIONS
Wada et al., "A 34ns 1Mb CMOS SRAM Using Triple Poly", IEEE International Solid-State Circuits Conference, pp. 262-263, Feb. 1987.

Primary Examiner—Stanley D. Miller
Assistant Examiner—Margaret Rose Wambach
Attorney, Agent, or Firm—Finnegan, Henderson, Farabow, Garrett, and Dunner

[57] ABSTRACT

A semiconductor integrated circuit equipped with an input buffer operation error preventing circuit is disclosed. A semiconductor integrated circuit comprises a data output signal level detector circuit for detecting at least one of a variation from a low level to a high level and that from a high level to a low level of a signal outputted from a circuit of a stage preceding an output buffer and for generating a clock pulse and an input buffer threshold level control circuit for controllably varying the threshold level of a first-stage gate in an input buffer by inputting the clock pulse so as to cancel a fall in an input level detection margin of the input buffer which is caused when the output data of the output buffer varies from a "0" level to a "1" level and vice versa.

14 Claims, 11 Drawing Sheets

D_OUT $V_{DD}$ $V_{SS}$

INPUT SIGNAL

NODE A

FIG. 8A NODE B
FIG. 8B NODE C
FIG. 8C $\phi_{ROUT}$
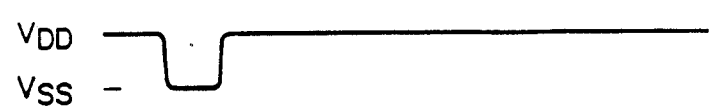
FIG. 8D $\phi_{FOUT}$
FIG. 8E $\phi_N$
FIG. 8F $\phi_P$
FIG. 8G $D_{OUT}$
FIG. 8H $V_{DD}$
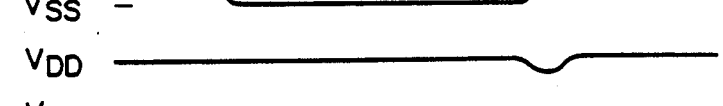
FIG. 8I $V_{SS}$
FIG. 8J INPUT SIGNAL
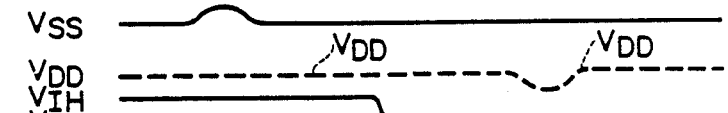
FIG. 8K NODE A

FIG.10A NODE D 
FIG.10B NODE E 
FIG.10C $\phi_{ROUT}$ 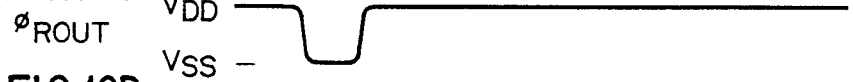
FIG.10D $\phi_{FOUT}$ 
FIG.10E $\phi_N$ 
FIG.10F $\phi_P$ 
FIG.10G $D_{OUT}$ 
FIG.10H $V_{DD}$ 
FIG.10I $V_{SS}$ 
FIG.10J INPUT SIGNAL 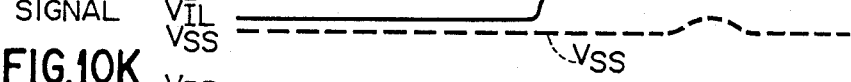
FIG.10K NODE A 

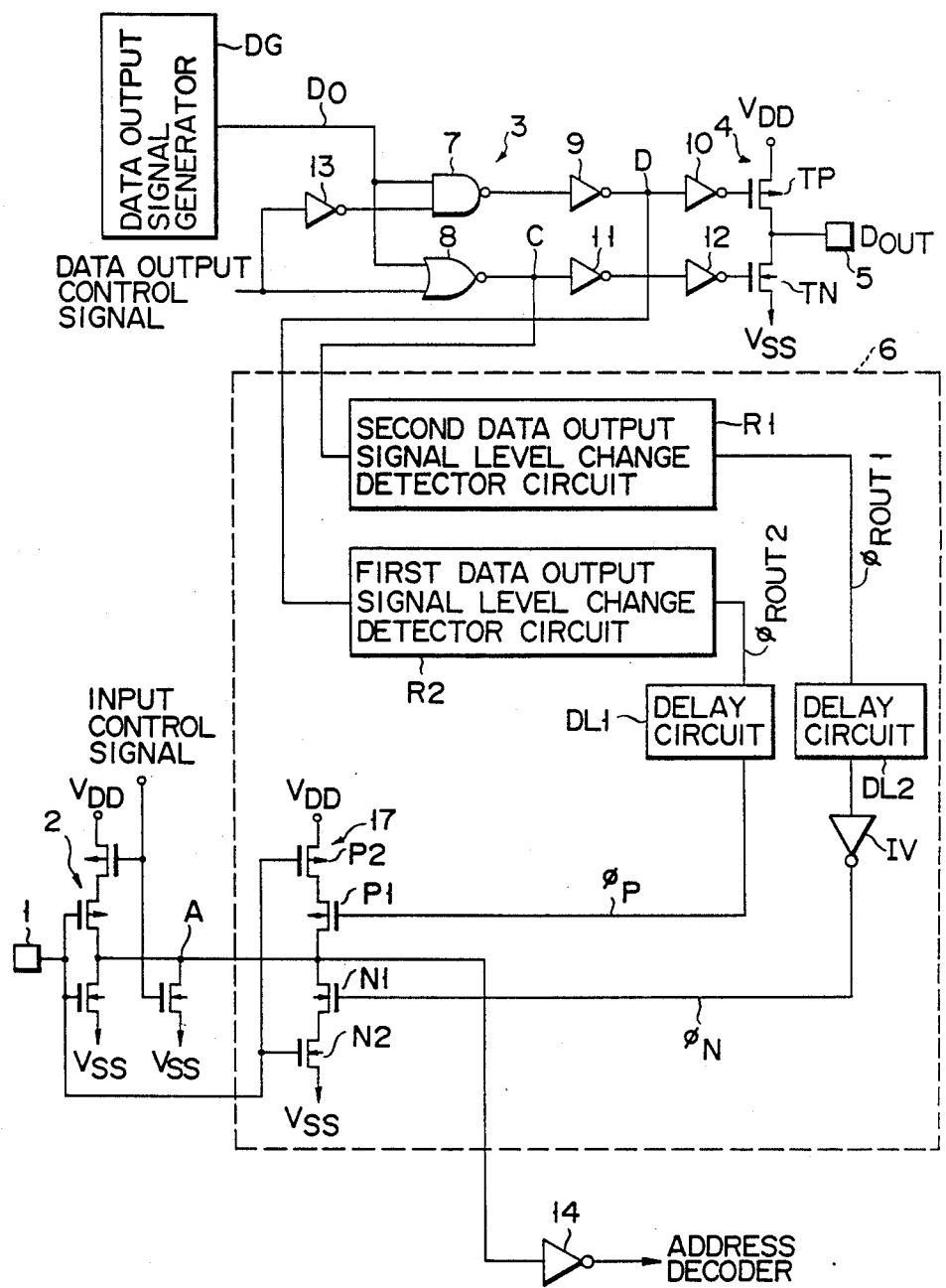
F I G. 11

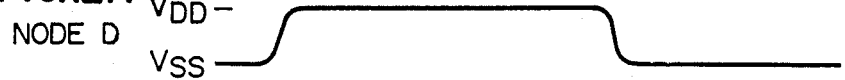
FIG.12A NODE D
FIG.12B NODE C
FIG.12C φROUT1
FIG.12D φROUT2
FIG.12E φN
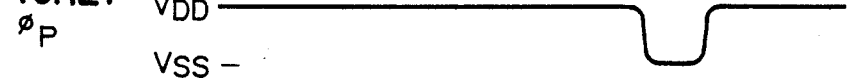
FIG.12F φP
FIG.12G DOUT
FIG.12H VDD
FIG.12I VSS
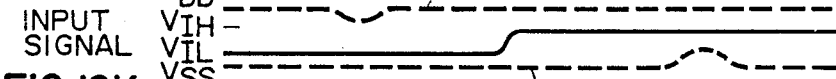
FIG.12J INPUT SIGNAL
FIG.12K NODE A FIG.14A NODE B
FIG.14B NODE E
FIG.14C $\phi_{FOUT1}$
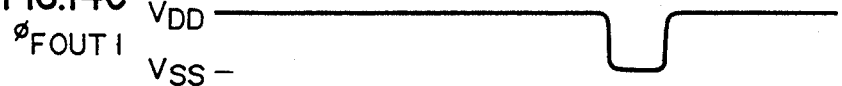
FIG.14D $\phi_{FOUT2}$
FIG.14E $\phi_N$
FIG.14F $\phi_P$
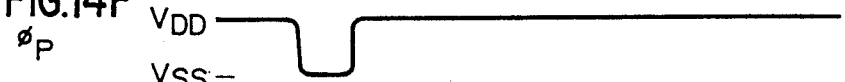
FIG.14G $D_{OUT}$
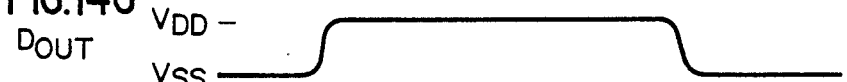
FIG.14H $V_{DD}$
FIG.14I $V_{SS}$
FIG.14J INPUT SIGNAL
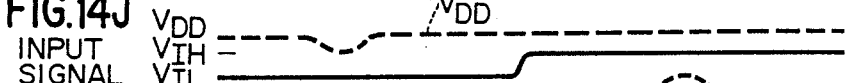
FIG.14K NODE A

ERROR PREVENTING CIRCUIT

BACKGROUND OF THE INVENTION

1. Field of the Invention

The present invention relates to a semiconductor integrated circuit having an input buffer operation error preventing circuit for preventing an input signal level error detection operation at an input buffer which is caused by an output noise upon a variation in the output data of an output buffer.

2. Description of the Related Art

In a semiconductor integrated circuit, if in order to obtain a high-speed access time the drive power of a data output buffer is increased to allow a high-speed rise and fall in an output data signal, then a noise signal is generated in a power supply line (including a ground line) due to a temporary large current through the output buffer. In this case, the output noise induces an input level detection error at, for example, a signal input buffer, causing a problem as will be set forth below.

FIGS. 1 and 2 show an output buffer and input buffer, respectively, and FIGS. 3A–3E show the state of a typical error detection operation of the input buffer at the time when the output data of the output buffer varies. That is, at a "0" level output time of the output buffer, a noise signal is induced on a $V_{SS}$ line (a ground line) due to a drive peak current of an N-channel transistor TN in the output buffer, resulting in a potential variation. At this time, if in the input buffer an input signal of a TTL (transistor-transistor logic) level is a high level and there is a small margin in the input signal level, an input buffer of a first stage temporarily assumes the same state as upon receipt of a TTL input signal of a low level, due to the influence of a noise signal of a "$V_{SS}$ potential" level, causing an output node A of a first stage in the input buffer to go high temporarily. On the other hand, if at a "1" output level of the output buffer a noise signal is induced on the $V_{DD}$ power supply by a drive peak current of a P-channel transistor TP in the output buffer. If, at this time, the TTL input signal is at a low level in the input buffer and there is a small margin in that input signal level, the input buffer of the first stage temporarily assumes the same state as upon receipt of a TTL input signal of a high level, due to the influence of a noise signal of a "$V_{DD}$" potential level, causing the output node A of the first stage in the input buffer to go low temporarily.

In order to prevent the aforementioned problem, that is, to prevent an operation error of the input buffer resulting from the output noise upon a variation in the output data, the usual practice is to reduce the drive power of the output buffer and hence to reduce an amount of output noise generated or, in a memory of a multi-bit structure, to reduce an amount of output noise generated, by displacing each bit output a corresponding time little by little. These methods present a problem because they are used at the sacrifice of data read-out speed. Another method is by, prior to the varying of an output at an output buffer, to conduct current at input and output terminals of a final stage of the output buffer so that, with the output waveform made less sharp, an output noise component may be reduced. For this method, reference is made to Wada, T., et al., "A 34ns 1Mb CMOS SRAM using Triple Poly", 1 SSCC DIGEST OF TECHNICAL PAPERS, pp 262 to 263; February, 1987. According to this method, the input and output terminals of the output buffer are forced into conduction, offering a risk of inducing a large current therethrough or rather inducing a power supply potential variation. Furthermore, there is also a risk that the aforementioned conduction operation will be performed at the sacrifice of a data readout speed.

SUMMARY OF THE INVENTION

It is accordingly the object of the present invention to provide a semiconductor integrated circuit having an input buffer operation error preventing circuit, which, without the sacrifice of any data read-out speed, can prevent any input buffer's error due to an output noise caused upon a variation in output data which would otherwise be involved in a conventional semiconductor integrated circuit.

According to the present invention, a semiconductor integrated circuit equipped with an input buffer operation error preventing circuit comprises a data output signal level detector circuit for detecting at least one of a variation from a low level from a high level and that from a high level to a low level of a signal of a circuit of a stage preceding an output buffer and for generating a clock pulse and an input buffer threshold level control circuit for controllably varying the threshold level of a first-stage gate in an input buffer by inputting the clock pulse so as to cancel a fall in an input level detection margin of the input buffer which is caused when the output data of the output buffer varies from a "0" level to a "1" level and vice versa.

According to the semiconductor integrated circuit having an input buffer's operation error preventing circuit, when an input level detection margin of the input buffer is to be decreased by a variation of the power supply potential caused by an output noise upon a variation in the output data of the output buffer, the threshold voltage level of the first-stage gate of the input buffer varies in a direction toward cancelling a decrease of the input level detection margin, thereby preventing the logical level of the input signal from being erroneously detected. Furthermore, the threshold voltage control operation can be performed without the sacrifice of the data read-out speed.

Brief Description of the Drawings

FIGS. 8A–8K are timing diagrams of the semiconductor integrated circuit of the present invention including the input buffer's operation error preventing circuit;

FIG. 10A–10K are timing diagrams of the input buffer operation error preventing circuit of FIG. 9;

FIG. 11 is a circuit arrangement of a semiconductor integrated circuit according to another embodiment of the present invention, including an input buffer operation error preventing circuit;

FIG. 12A–12K are timing diagrams of the semiconductor integrated circuit of FIG. 11;

FIG. 14A–14K are timing diagrams showing the operation of the semiconductor integrated circuit of FIG. 13.

Detailed Description of the Preferred Embodiments

The embodiments of the present invention will be explained below in more detail with reference to the drawings.

Figure 1:
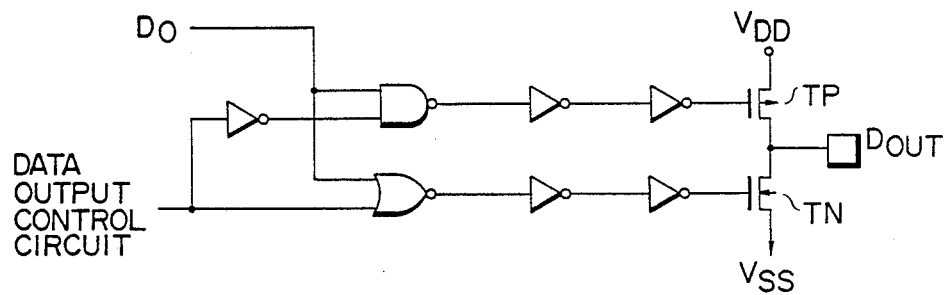
FIG. 1 shows an output buffer and output control circuit used to which explain an input buffer's input signal level error detection operation upon a variation in the output data of an output buffer in a semiconductor integrated circuit.
Figure 2:
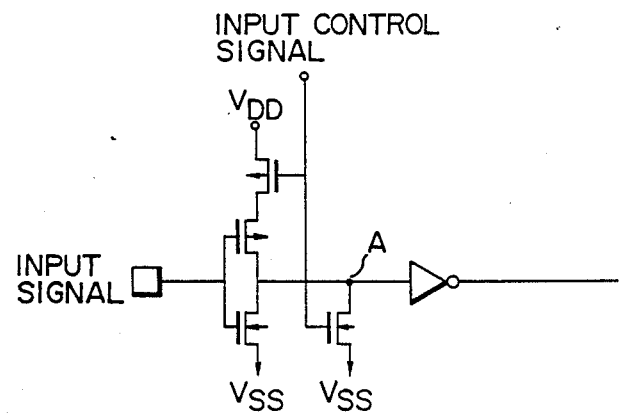
FIG. 2 shows the input buffer referred to in the description of FIG. 1.
Figure 3A:
FIG. 3A–3E are timing diagrams showing an input level error detection operation of a TTL input signal of the input buffer shown in (FIG. 2) which is caused upon a variation in the output data of the output buffer of FIG. 1.
Figure 3B:
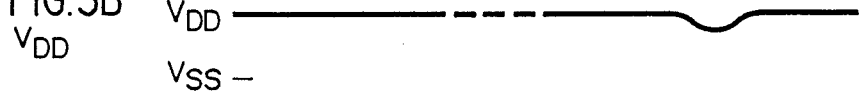
Figure 3C:
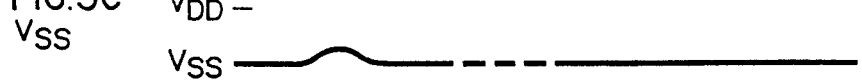
Figure 3D:
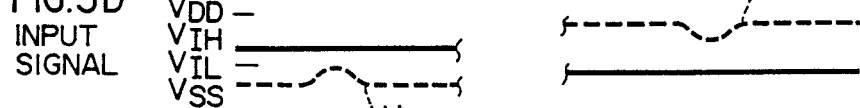
Figure 3E:
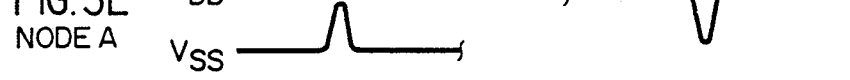
Figure 4:
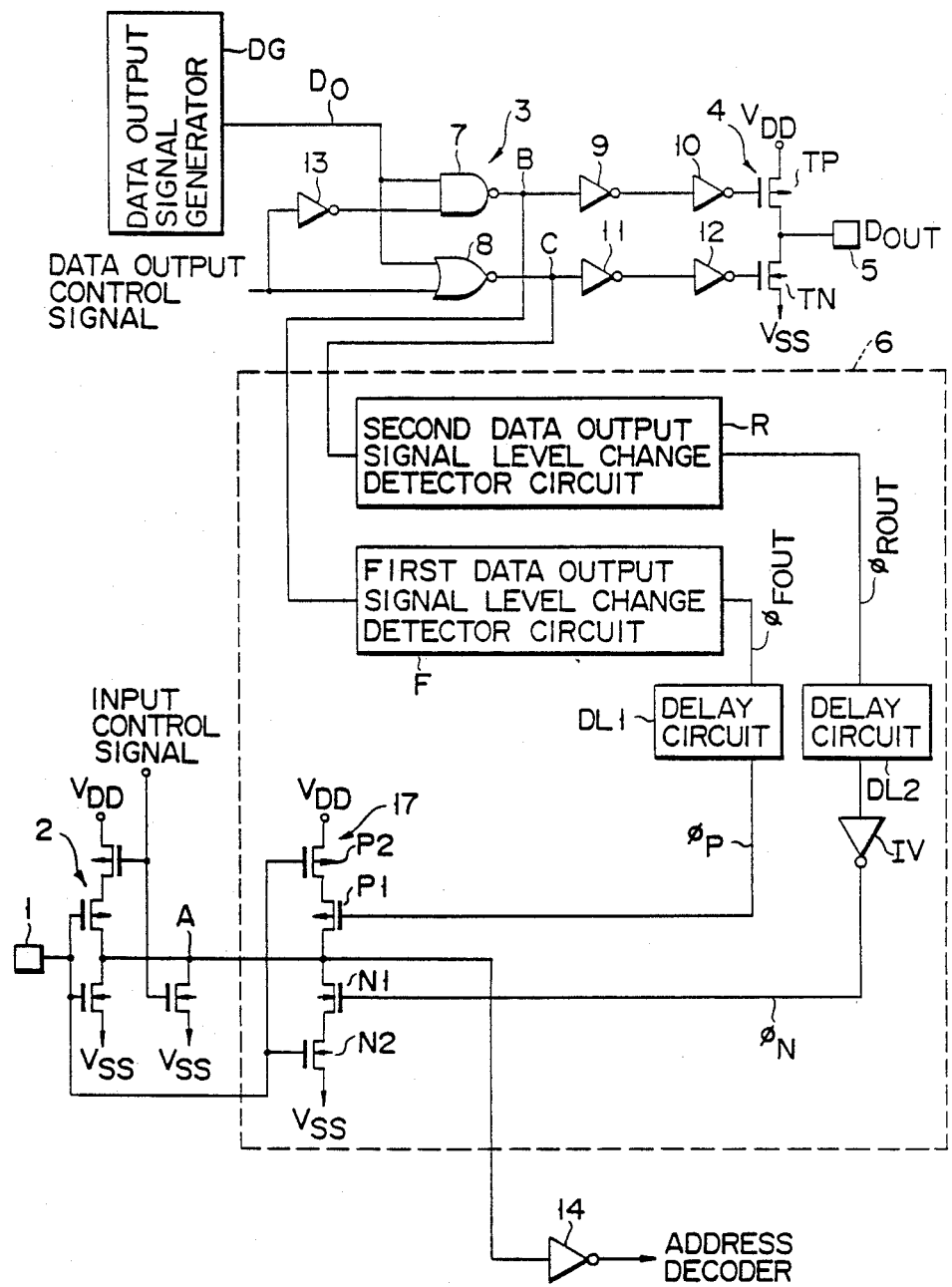
FIG. 4 is a circuit arrangement according to an embodiment of the present invention which includes an input buffer operation error preventing circuit including first and second data output signals level detector circuits.

In a semiconductor memory device shown in FIG. 4, reference numeral 1 denotes an address signal input pad; 2, an input buffer; 3, an output control circuit; 4, an output buffer; 5, a data output pad; 6, an operation error preventing circuit; and DG, a data output signal generator DG, noting that $V_{DD}$ and $V_{SS}$ represent a power supply potential and ground potential, respectively. The input buffer 2 is comprised of CMOS type two-input NOR gates, one input of which is supplied with a TTL-level input signal via the input pad 1 and the other input of which is supplied with a chip enable "0" level input control signal. The output control circuit 3 comprises a NAND gate 7 and NOR gate 8 supplied at one input with a data output signal Do from the data output signal generator DG, CMOS inverters 9 and 10 connected as a two-stage array to the output of the NAND gate 8, CMOS inverters 11 and 12 connected as a two-stage array to the output of the NOR gate 8, and a CMOS inverter 13 supplying an inverted replica of a data output control signal to the corresponding other terminal of the NAND gate 7, the data output control signal being connected to the corresponding other input of the NOR gate 8. The output buffer 4 is of such a type that a series circuit of a P-channel transistor TP and N-channel transistor TN is connected across the power supply terminal $V_{DD}$ and the ground terminal $V_{SS}$ with the drains of the transistors TP and TN connected to the data output pad 5.

The operation error prevention circuit 6 comprises first and second data output signal level detector circuits F and R which detect a variation in signal levels on output nodes B and C of the preceding circuits (for example, the NAND gate 7 and NOR gate 8 in the output control circuit 3) of the output buffer 4, a delay circuit DL1 connected in series to the output of the first data output signal level detector circuit F, a series circuit of a delay circuit DL2 and CMOS inverter IV which is connected to the output of the second data output signal level detector circuit R, and P channel transistors P2 and P1 and N channel transistors N1 and N2 connected as a series array between the power supply terminal $V_{DD}$ and the ground terminal. The gates of P channel transistor P2 and N channel transistor N2 are connected to a common junction of the input buffer 2 and a common drain junction of the P channel transistor P1 and N-channel transistor N1 is connected to an output node A of the input buffer 2. The output $\phi p$ of the delay circuit DL1 and output N of an inverter IV are supplied to the corresponding terminals of the P channel transistor P1 and N channel transistor N1, respectively.

Figure 5A:
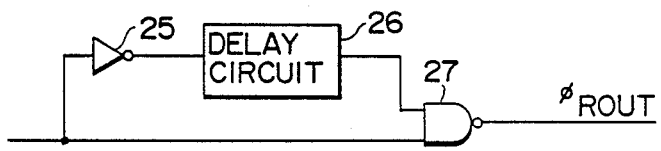
FIG. 5A is a second data output signal level detector circuit of FIG. 4
Figure 5B:
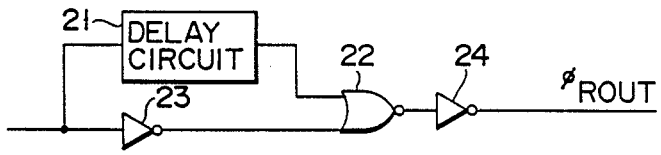
FIG. 5B shows another variant of the second data output signal level detector circuit of FIG. 4.

The second data output signal level detector circuit R detects a "rise" variation time of a data output signal, that is, a time immediately preceding a time of change from the ON to the OFF of the N channel transistor TN in the output buffer 4 of the embodiment and delivers a "0" level clock pulse $\phi ROUT$. The second data output signal level detector circuit R is of such a type as shown, for example, in FIG. 5A or 5B. That is, in the circuit shown in FIG. 5B, a data output signal to the second detector circuit is fed past a delay circuit 21 to one input of a NOR gate 22 and past an inverter 23 to the other input of the NOR gate 22, the output of the NOR gate 22 being inverted by an inverter to provide a clock pulse $\phi ROUT$. In the circuit shown in FIG. 5A, a data output signal is supplied past a series circuit of an inverter 25 and delay circuit 26 to one input of a NAND gate 27 and directly to the NAND gate 27, a clock H 10 pulse $\phi ROUT$ being taken out from the NAND gate 27.

Figure 6A:
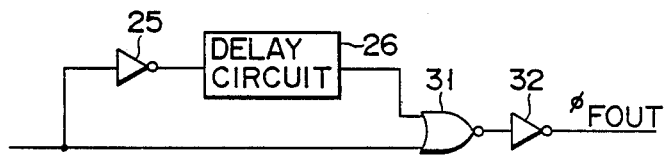
FIG. 6A shows a first data output signal level detector circuit of FIG. 4
Figure 6B:
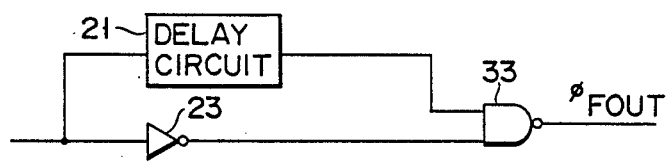
FIG. 6B shows another variant of the first data output signal level detector circuit of FIG. 4.

The first data output signal level detector circuit F detects a fall variation time of a data output signal to the circuit F, that is, a time immediately preceding a variation from on OFF to an ON of the P channel transistor TP is this embodiment, an delivers a "0" level clock pulse $\phi FOUT$. The circuit F is of such a type as shown, for example, in FIG. 6A or 6B. That is, the circuit of FIG. 6A is the same as that of FIG. 5B except that a series circuit of a NOR gate 31 and inverter 32 is employed in place of the NAND gate 27, while the circuit of FIG. 6B is the same as that of 5B except that a NAND gate 33 is employed in place of the series circuit of the NOR gate 22 and inverter 24.

Figure 7A:
FIG. 7A shows a delay circuit as shown in FIGS. 5A 5B, 6A and 6B
Figure 7B:
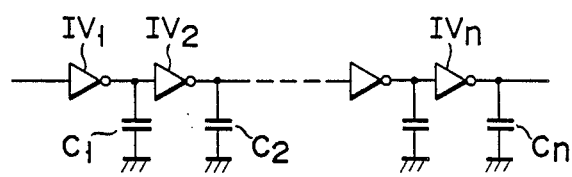
FIG. 7B shows another variant of the delay circuit of FIGS. 5A, 6A and 6B.

The delay circuits 21 and 26 which are used in the circuits of FIG. 5A, 5B, and 6A and 6B are of such a type as shown in FIGS. 7A and 7B and comprise an even number of series-connected inverters IV to IVn and FIG. 7B a plurality of capacitors $C_1$ to $C_n$ are connected, as required, each between a corresponding stage inverter output and ground.

The delay circuits DL1 and DL2 delay the clock pulses $\phi FOUT$ and $\phi ROUT$ by a predetermined time and control the operation timing of the P channel transistor P1 and the N channel transistor N1. The P channel transistors P2 and P1 and the N channel transistors N1 and N2 controllably vary the threshold voltage level of the first stage gate in the input buffer 2 in a direction toward cancelling a fall in the input level detection margin of the input buffer 2 which is caused by an output noise (a power supply potential variation) at the time of a variation in the output buffer's output data from a "0" level to a "1" level and from a "1" level to a "0" level. It is thus possible to provide an input buffer threshold level control circuit as set forth above.

An output signal of the input buffer 2 is input to an address decoder via an inverter 14.

The semiconductor integrated circuit of the present invention will be explained below in connection with preventing an input buffer operation error at the time of a variation in a data output, while referring to FIGS. 8A-8K.

Now suppose that, for example, "0" data is read out of the output buffer 4. Since, in this case, a potential on the node C of the output control circuit 3 varies from a low level to a high level, a "0" level clock pulse φROUT is output from the second data output signal level detector circuit R. The clock pulse φROUT is time-controlled via the delay circuit DL2 and inverter IV and converted to a "1" level clock pulse φN. The clock pulse φN is supplied to the gate of the N channel transistor N1. When, on the other hand, data "0" is output, a ground $V_{SS}$ level somewhat varies temporarily due to a temporarily large current at the output buffer is general, affecting the $V_{SS}$ potential at the signal input buffer. If at this time a TTL level input signal which is input to the input buffer 2 is at a low level, no problem arises because there is an adequate margin. If, on the other hand, the TTL level input signal is at a high level $V_{IH}$ and there is less detection margin, there is a risk that an error detection operation will occur as already set forth above. At this time, according to the embodiment of the present invention, the N channel transistor N2 is turned ON upon receipt of the TTL input signal and N channel transistor N1 is temporarily turned ON upon receipt of the clock pulse φN. In this case, the threshold voltage of the input buffer 2 goes low temporarily and a high level detection margin is great, thus preventing a temporary increase in a potential level on the output node A of the input buffer 2.

If, on the other hand, "1" data is read out of the output buffer 4, a potential on the node B of the output control circuit 3 suffers a variation from a high level to a low level and hence a "0" level clock pulse φFOUT is output from the first data output signal level detector circuit F. The clock pulse φFOUT passes through the delay circuit DL1 and has its timing controlled to appear as a clock pulse φP The clock pulse φP is input to the gate of the P channel transistor P1. If, at this time, the TTL input signal to the input buffer 2 is at a high level, no problem is involved due to the presence of an adequate detection margin. If, on the other hand, the TTL input signal is at a low level and hence there is a low detection margin, there is a risk that an error detection operation will occur as set forth above. At this time, according to the present invention, the P channel transistor P2 is turned ON by that TTL input signal and P channel transistor P1 is rendered on temporarily by the clock pulse φP, causing the threshold voltage of the input buffer 2 to become a high level temporarily and hence producing a low level detection margin. As a result, the situation under which the potential on the output node A of the input buffer 2 will be made temporarily low can be avoided.

The present invention can be changed or modified in various ways without departing from the spirit and scope of the present invention. For example, it may be possible to rearrange the P channel transistors P2 and P1 and the N channel transistors N1 and N2 in the input buffer threshold level control circuit 17 in a proper way relative to $V_{DD}$ and $V_{SS}$.

Figure 9:
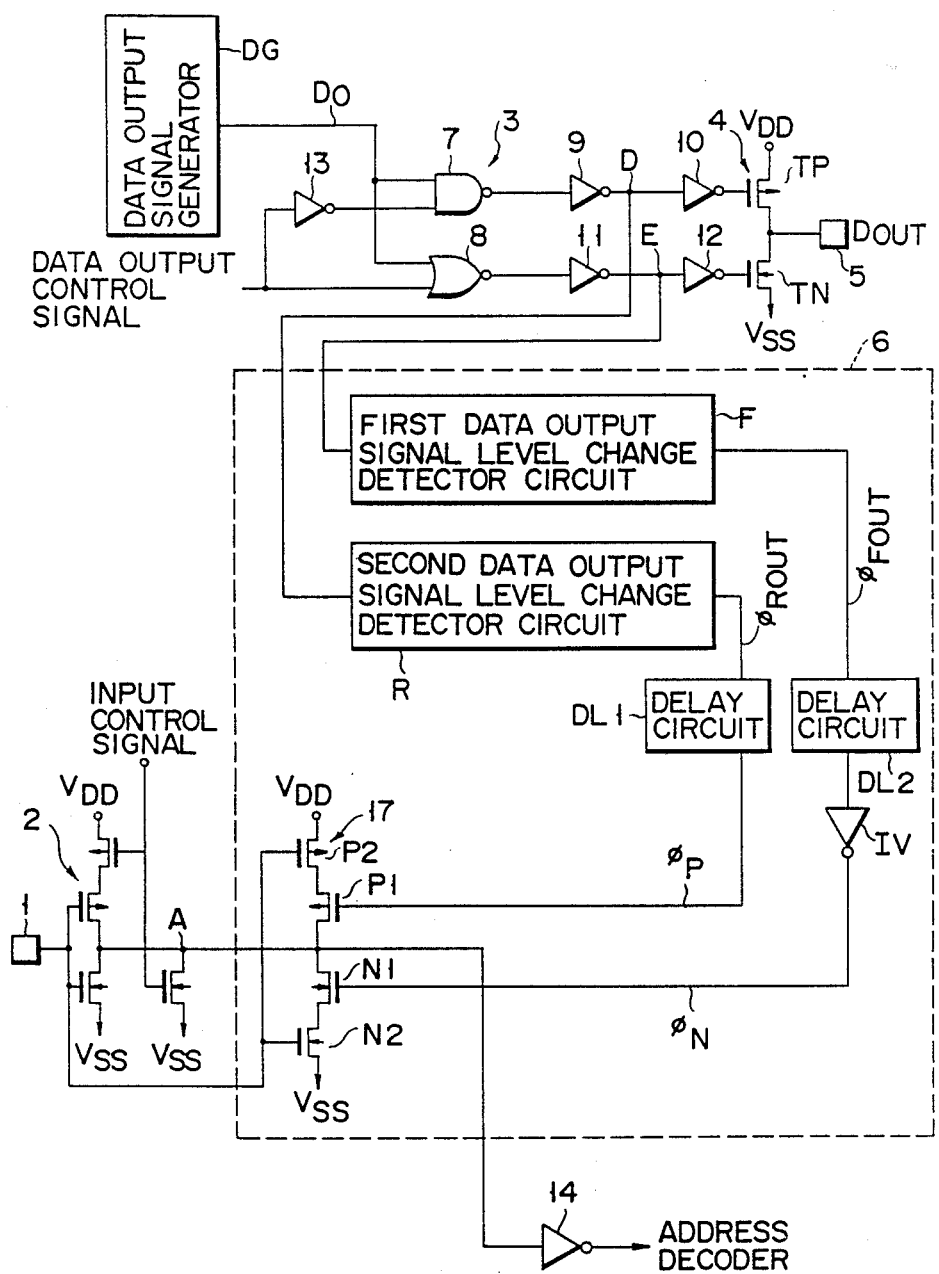
FIG. 9 is a circuit arrangement showing a semiconductor integrated circuit according to another embodiment of the present invention, including an input buffer's operation error preventing circuit.

In the case where the signal level variation on output nodes D and E of inverters 9 and 11 in an output control circuit is to be detected in another embodiment of the present invention as shown in FIG. 9, a signal rise variation on the output node D may be detected by a second data output signal level detector circuit R and a signal fall variation on the output node E may be detected by a first data output signal level detector circuit F. In the circuit arrangement shown in FIG. 9, the same reference numerals are employed to designate parts or elements corresponding to those shown in FIG. 4, noting that the signal waveforms of the respective parts are shown in FIG. 10A-10K.

In the embodiment shown in FIG. 11, a signal fall variation on an output node C may be detected by a second data output signal level detector circuit R1 to generate a clock pulse φROUT1 and a signal fall variation on an output node D may be detected by a first data output signal level detector circuit R2 to generate a clock pulse φROUT2.

In the circuit shown in FIG. 11, the same reference numerals are employed to designate parts or elements corresponding to those shown in FIG. 4, noting that the signal waveforms of the respective parts are shown in FIG. 12.

Figure 13:
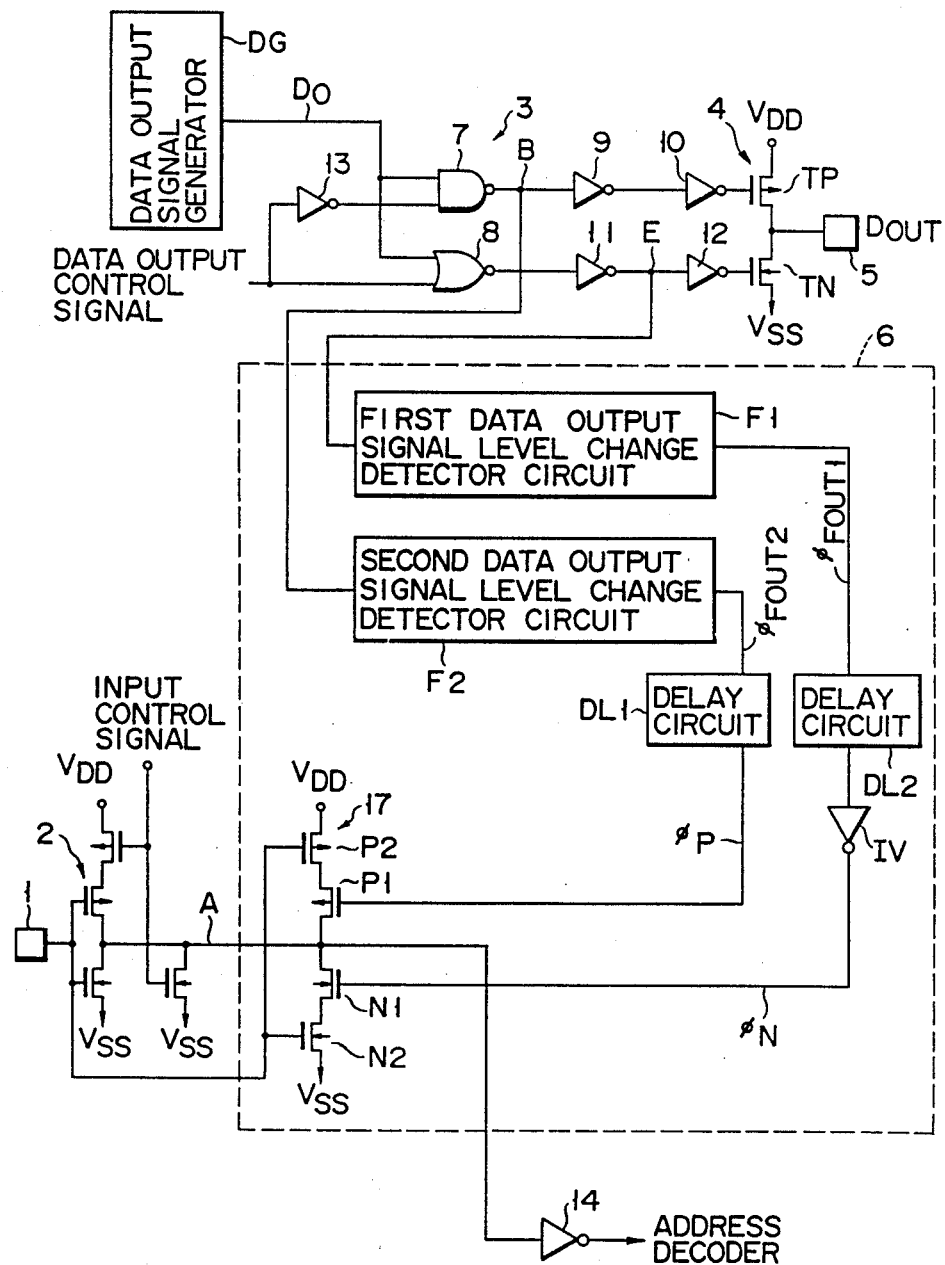
FIG. 13 is a circuit arrangement of a semiconductor integrated circuit according to another embodiment of the present invention.

In an embodiment shown in FIG. 13, a signal fall variation on an output node E may be detected by a first data output signal level detector circuit F1 to generate a clock pulse φFOUT1 and a signal fall variation on an output node B may be detected by another data output signal level detector circuit F2.

In the circuit shown in FIG. 13, the same reference numerals are employed to designate parts and elements corresponding to those shown in FIG. 4, noting that the signal waveforms of the respective parts are shown in FIG. 14.

Although, in the aforementioned embodiments, the control of the input buffer threshold levels has been explained as being carried out by detecting the data output signal rise variation and data output signal fall variation. By detecting only the data output signal rise variation or only the data output signal fall variation, as the case may be, the input buffer threshold level may be so controlled as to allow that input buffer threshold level to vary in a direction toward cancelling the fall of an input level detection margin at that time.

The present invention can be applied generally to a semiconductor integrated circuit including input and output buffers.

What is claimed is:

1. A semiconductor integrated circuit including an input buffer operation error preventing circuit, comprising:

a data output signal generator for generating a first or a second logic level data output signal;

an output control circuit means, including first and second current paths for first and second current path signals having first or second logic levels, for receiving the logic level data output signal from the data output signal generator, for generating said first and second current path signals from the logic level data output signal and for generating an output control signal having a first or a second logic level from each current path signal;

an output buffer, connected across first and second potential supply means, for receiving the output control signals from the output control circuit means and for generating a first or a second voltage level output buffer signal in accordance with the logic levels of the output control signals;

an input buffer, connected across the first potential supply means and the second potential supply means, for receiving an input signal of a predetermined level;

data output signal level detector means for detecting at least one of a transition of the output buffer signal from said first voltage level to said second voltage level and a transition of the output buffer signal from said second voltage level to said first voltage level by detecting at least one of a transition of one of said current path signals from the first logic level to the second logic level and a transition of one of said current path signals from the second logic level to the first logic level and for generating at least a first or a second detection signal; and input buffer threshold level control means, responsive to the first or the second detection signals, for controlling the input buffer so as to cancel a fall in a level detection margin of the input signal of the input buffer caused by a potential variation of the first or second potential supply means resulting from a transition of the output buffer signal from the first voltage level to the second voltage level or from the second voltage level to the first voltage level.

2. The semiconductor integrated circuit according to claim 1, wherein said data output signal level detector means detects a transition of one of said current path signals from a first logic level to a second logic level or from the second logic level to the first logic level prior to a transition of said output buffer signal from said first voltage level to said second voltage level or from the second voltage level to the first voltage level and generates said first or second detection signal.

3. The semiconductor integrated circuit according to claim 2, wherein said data output signal level detector means comprises a first data output signal level detector for detecting a transition of one of said current path and for generating said first detection signal, a first delay circuit connected to an output of the first data output signal level detector, a second data output signal level detector for detecting a transition of the other of said current path signals from the second logic level to the first logic level and for generating a second detecting signal, a second delay circuit connected to an output of the second data output signal level detector and a first inverter connected to an output of the second delay circuit.

4. The semiconductor integrated circuit according to claim 3, wherein said first data output signal level detector comprises:
a second inverter,
a third delay circuit,
a first NOR gate, having two input terminals and an output terminal, which receives said current path signal at the first input terminal and which receives said current path signal at the second input terminal via a series circuit of said second inverter and said third delay circuit, and
a third inverter connected to said output terminal of said NOR gate.

5. The semiconductor integrated circuit according to claim 3, wherein said first data output signal level detector comprises:
a second inverter,
a third delay circuit, and
a first NAND gate, having two input terminals, which receives said current path signal at one of said input terminals via said second inverter and which receives said current path signal at the other of said input terminal via said third delay circuit.

6. The semiconductor integrated circuit according to claim 3, wherein said second data output signal level detector comprises:
a second inverter,
a third delay circuit,
a NOR gate, having two input terminals and an output terminal, which receives said current path signal at one of said input terminals via the second inverter and which receives said current path signal at the other of said input terminals via the third delay circuit, and
a third inverter connected to said output terminal of said NOR gate.

7. The semiconductor integrated circuit according to claim 3, wherein said second data output signal level detector comprises:
a second inverter,
a third delay circuit,
a NAND gate, having two input terminals and an output terminal, which receives said current path signal directly at one of said input terminals and which receives said current path signal at the other of said input terminals via a series circuit of said second inverter and said third delay circuit.

8. The semiconductor integrated circuit according to claim 1, wherein said input buffer threshold level control means comprises first and second transistors of a first channel type and third and fourth transistors of a second channel type connected across said first potential supply means and said second potential supply means, said second and fourth transistors are controlled by said input signal of said input buffer and said first and third transistors are controlled by said first and second detection signals, respectively, so that, during a period of time in which the first and second detection signals are output at a time of a transition of one of the current path signals from the first logic level to the second logic level or from the second logic level to the first logic level, an output terminal voltage of said input buffer is varied so as to cancel a fall in an input signal level detection margin of said input buffer which is caused by a potential change in said first potential supply means or said second potential supply means.

9. The semiconductor integrated circuit according to claim 4, wherein said third delay circuit comprises a plurality of series-connected inverters.

10. The semiconductor integrated circuit according to claim 6, wherein said fifth delay circuit comprises a plurality of series-connected inverters.

11. The semiconductor integrated circuit according to claim 6, wherein said third delay circuit comprises a plurality of series-connected inverters.

12. The semiconductor integrated circuit according to claim 7, wherein said third delay circuit comprises a plurality of series-connected inverters.

13. The semiconductor integrated circuit according to claim 8, wherein said first transistor and third transistor have their current paths connected together and are connected to an output of said input buffer.

14. The semiconductor integrated circuit according to claim 1, wherein said first and second detection signals are clock pulses.

* * * * *

UNITED STATES PATENT AND TRADEMARK OFFICE
CERTIFICATE OF CORRECTION

PATENT NO. : 4,959,560
DATED : September 25, 1990
INVENTOR(S) : Takayuki Ootani It is certified that error appears in the above-identified patent and that said Letters Patent is hereby corrected as shown below:

Claim 3, column 7, line 40, "path" should be followed by --signals from a first logic level to a second logic level--.

Claim 3, column 7, line 46, change "detecting" to --detection--.

Claim 10, column 8, line 53, change "claim 6" to --claim 5--, and "fifth" should be --third--.

Signed and Sealed this

Second Day of November, 1993

Attest:

BRUCE LEHMAN

*Attesting Officer*     Commissioner of Patents and Trademarks